United States Patent
Hsieh et al.

(10) Patent No.: US 9,785,046 B2
(45) Date of Patent: Oct. 10, 2017

(54) PATTERN VERIFYING METHOD

(71) Applicant: UNITED MICROELECTRONICS CORP., Hsin-Chu (TW)

(72) Inventors: Te-Hsien Hsieh, Kaohsiung (TW); Ming-Jui Chen, Hsinchu (TW); Cheng-Te Wang, Hsinchu County (TW); Jing-Yi Lee, Tainan (TW); Jian-Yuan Ma, Tainan (TW); Yan-Chun Chen, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 266 days.

(21) Appl. No.: 14/601,250

(22) Filed: Jan. 21, 2015

(65) Prior Publication Data

US 2016/0147140 A1    May 26, 2016

(30) Foreign Application Priority Data

Nov. 21, 2014    (CN) .......................... 2014 1 0673518

(51) Int. Cl.
| | |
|---|---|
| *G03F 1/72* | (2012.01) |
| *G03F 1/84* | (2012.01) |
| *G03F 1/36* | (2012.01) |
| *G03F 1/70* | (2012.01) |

(52) U.S. Cl.
CPC ............... *G03F 1/36* (2013.01); *G03F 1/70* (2013.01); *G03F 1/72* (2013.01); *G03F 1/84* (2013.01)

(58) Field of Classification Search
CPC ................ G03F 1/36; G03F 1/72; G03F 1/84
See application file for complete search history.

(56) References Cited

U.S. PATENT DOCUMENTS

| | | | | |
|---|---|---|---|---|
| 8,701,052 | B1 * | 4/2014 | Kuo .......................... | G03F 1/36 716/51 |
| 8,782,572 | B1 * | 7/2014 | Huang ....................... | G03F 1/36 716/53 |
| 8,863,043 | B1 * | 10/2014 | Usui .................... | G06F 17/5081 430/30 |
| 2008/0069432 | A1 * | 3/2008 | Hsu .......................... | G03F 1/36 382/145 |
| 2009/0298205 | A1 | 12/2009 | Nagahara | |
| 2012/0040280 | A1 * | 2/2012 | Agarwal .............. | G03F 7/70433 430/30 |
| 2013/0182940 | A1 | 7/2013 | Hsu | |
| 2013/0232456 | A1 * | 9/2013 | Kallingal .................. | G03F 1/36 716/53 |
| 2014/0117488 | A1 * | 5/2014 | Wallace ............... | H01L 21/0273 257/499 |
| 2014/0253902 | A1 * | 9/2014 | Sun ........................... | G03F 7/70 355/77 |

* cited by examiner

*Primary Examiner* — Stewart Fraser
(74) *Attorney, Agent, or Firm* — Winston Hsu

(57) ABSTRACT

The present invention provides a pattern verifying method. First, a target pattern is decomposed into a first pattern and a second pattern. A first OPC process is performed for the first pattern to form a first revised pattern, and a second OPC process is performed for the second pattern to form a second revised pattern. An inspection process is performed, wherein the inspection process comprises an after mask inspection (AMI) process, which comprises considering the target pattern, the first pattern and the second pattern.

11 Claims, 5 Drawing Sheets

PATTERN VERIFYING METHOD

BACKGROUND OF THE INVENTION

1. Field of the Invention

The present invention is related to a pattern verifying method, and more particularly, to a pattern verifying method that is used in double pattern technology (DPT) process.

2. Description of the Prior Art

In semiconductor manufacturing processes, in order to transfer an integrated circuit layout onto a semiconductor wafer, the integrated circuit layout is first designed and formed as a photo-mask pattern. The photo-mask pattern is then proportionally transferred to a photoresist layer positioned on the semiconductor wafer.

In recent years, with the increasing miniaturization of semiconductor devices, the design rule of line width and space between lines or devices becomes finer. However, the width is subject to optical characteristics. To obtain fine-sized devices in the exposure, the interval between transparent regions in a mask is scaled down with device size. When the light passes through the mask, diffraction occurs and reduces resolution. Moreover, when light passes through the transparent regions of a mask having different interval sizes, the light through the regions having small interval sizes is influenced by the transparent regions having large interval sizes and results in deformation of the transfer pattern.

A double-exposure technique has been developed in recent years. The double-exposure technique involves decomposing a target pattern into two separated patterns, which are then transferred to a photoresist layer respectively by two exposure processes. Since the pitch of the decomposed pattern is larger, the pattern can be formed by current exposure systems. However, there are still some problems needed to be overcome in the double-exposure technique.

SUMMARY OF THE INVENTION

The present invention therefore provides a pattern verification method which is specifically used in DPT process.

According to one embodiment of the present invention, a pattern verifying method is provided. The pattern verifying method is related to a DPT process and comprises a hard mask etching process to form a patterned hard mask. The patterned hard mask has a target pattern, and the DPT process comprises using a first photo-mask and a second photo-mask. First, a target pattern is decomposed into a first pattern and a second pattern. A first optical proximity correction (OPC) process is performed for the first pattern to form a first revised pattern, and a second OPC process is performed for the second pattern to forma second revised pattern. An inspection process is performed, wherein the inspection process comprises an after mask inspection (AMI) process, which comprises considering the target pattern, the first pattern and the second pattern.

The pattern verifying method provided by the present invention is mainly used in DPT process and is featured by considering every step in the DPT process. Accordingly, the formed patterned hard mask and/or the patterned target layer can have desired pattern.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
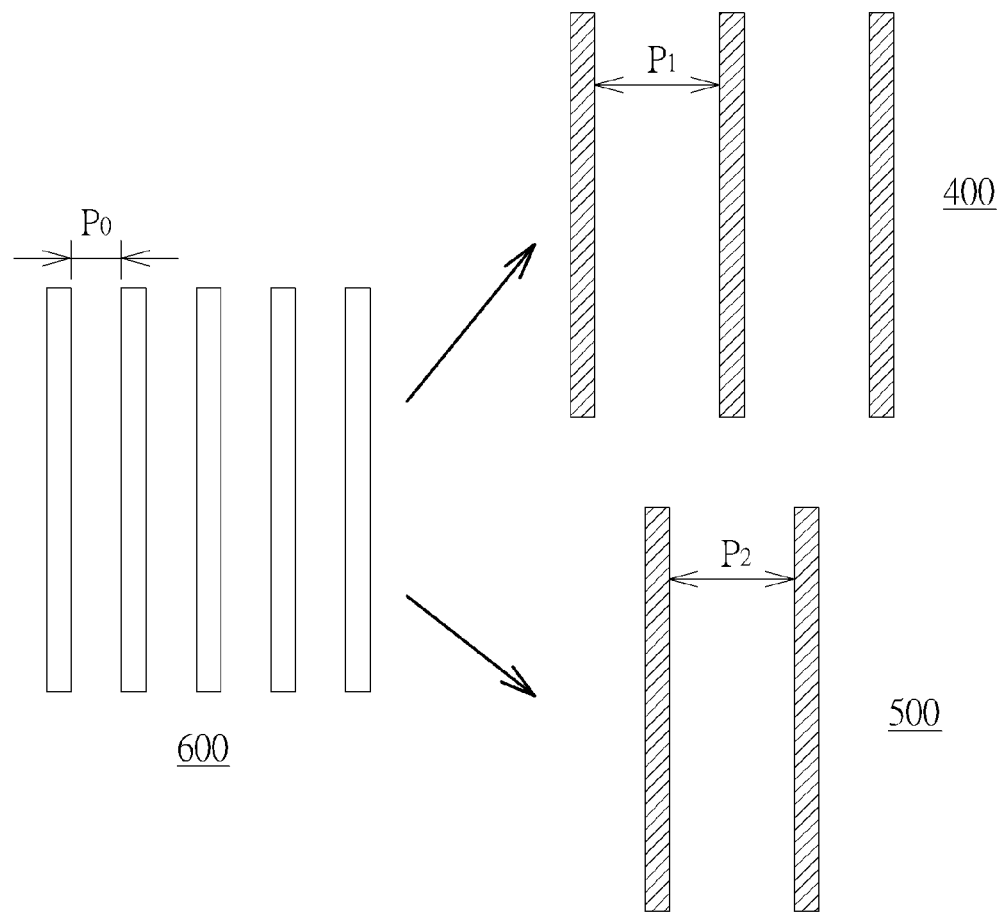
FIG. 1 to FIG. 8 show schematic diagrams of the steps of the DPT process according to one embodiment in the present invention.

The present invention relates to a pattern verifying method, especially a pattern verifying method applicable to double patterning technique (DPT). First, please refer to FIG. 1 to FIG. 8, showing schematic diagrams of DPT process according to one embodiment of the present invention. As shown in FIG. 1, a target pattern 600 is provided. For example, a target pattern 600 is input to a computer system (not shown). The term "target pattern" refers to the ideal pattern to be formed in a subsequent target layer (not shown), which reflects the layout of the subsequent integrated circuit. In one embodiment, since the target pattern 600 contains dense patterns (e.g., a plurality of stripe patterns) with quite small pitch P0, and cannot be formed by existing exposure tools in single lithography etching process. Therefore, as shown in FIG. 1, the present invention uses double patterning technique, which decomposes of the target pattern 600 into a first pattern 400 and a second pattern 500. The pitch P1 of the first pattern 400 and the pitch P2 of the second pattern 500 are preferably larger than the critical dimension (CD) of the exposure machine.

Figure 2:
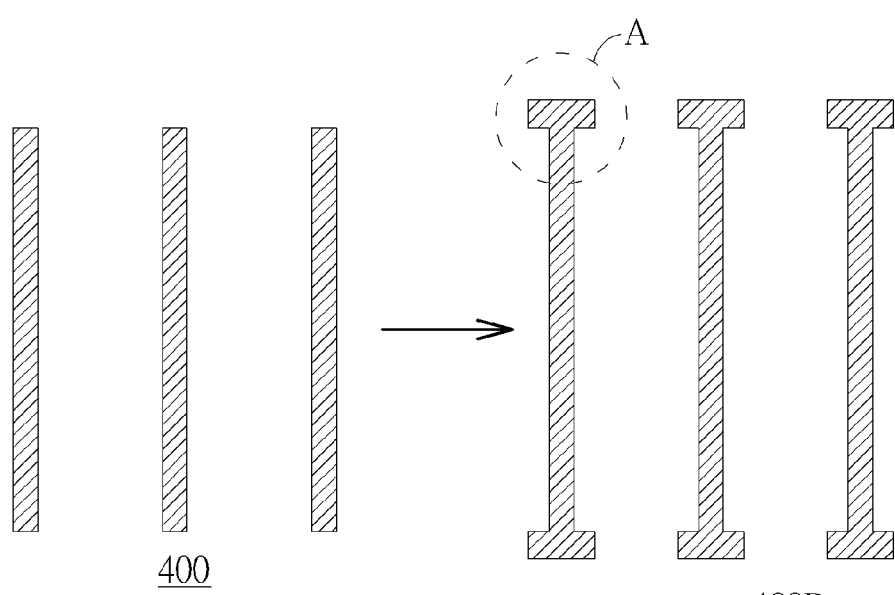

Next, as shown in FIG. 2, a first optical proximity correction (OPC) process is performed for the first pattern 400, thereby forming a first revised pattern 400R. Preferably, the first OPC process is performed in a computer system, and the rules thereof contains considering any parameters of the lithography process, such as, light source, the photoresist material and the photo-mask, in order to compensate the light diffraction effects. In one embodiment, comparing to original first pattern 400, the first revised pattern 400R has a hammer shape in area A, but the optical proximity correction process of the present invention is not limited thereto. In addition, a second OPC process is performed for the second pattern 500, thereby forming a second revised pattern 500R (not shown). The second OPC process is similar to the first OPC process and will not be repeated for the sake of simplicity. In one embodiment of the present invention, an additional OPC process may be performed for the target pattern 600, in which said OPC process comprises comparing the first revised pattern 400R and the second revised pattern 500R, to obtain a more accurate correction of the first revised pattern 400R and the second revised pattern 500R. After obtaining the first revised pattern 400R and the second revised pattern 500R, output them to form a first photo-mask 402 and a second photo-mask 502 respectively (not shown in FIG. 2, but will be shown in the following FIGS.)

Figure 3:
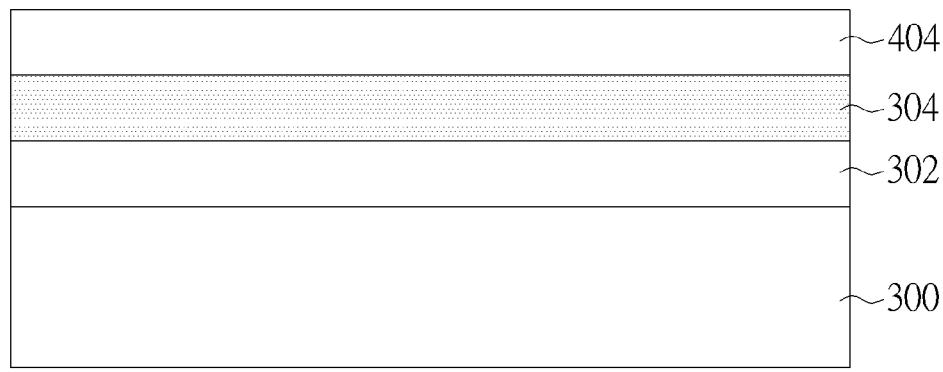

Then, a double patterning process can be performed by using this first photo-mask 402 and the second photo-mask 502. As shown in FIG. 3, a substrate 300 is provided, with a target layer 302, a hard mask 304 disposed thereon. The substrate 300 can include a semiconductor substrate, such as a silicon substrate, an epitaxial silicon substrate, a silicon germanium substrate, a silicon carbide substrate or a silicon-on-insulator (SOI) substrate. In another embodiment, the substrate 300 can include a non-semiconductor substrate, such as a glass substrate for a thin-film-transistor display device formed thereon, or a fused quartz for a photo mask formed thereon. In another embodiment, the substrate 300 can include a plurality of doping regions, one or a plurality of dielectric layers or a metal interconnect system in which one or a plurality of microelectronic components are disposed therein, such as a complementary metal oxide semiconductor (CMOS) or a photo-diode. The target layer 302 is a semiconductor layer where the target pattern 600 will be formed therein in the subsequent steps, and the material thereof is no limited. The hard mask 304 directly contacts the target layer 302, and is used as a mask in subsequent etching process. Preferably, the target layer 302 has an etching selectivity with respect to the target layer 302. In one embodiment, the hard mask 304 includes silicon nitride (SiN), silicon oxynitride (SiON), silicon carbide (SiC) or advanced pattern film (APF) provided by Applied Materials incorporation, but is not limited thereto. Next, a first photoresist layer 404 is formed on the hard mask 304. In one embodiment, an anti-reflection coating (ARC) can be formed below or above the first photoresist layer.

Figure 4:
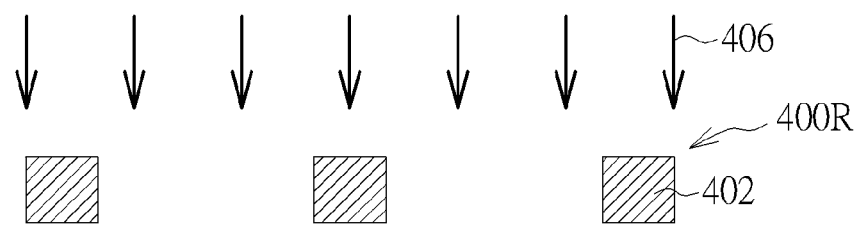
Figure 4:
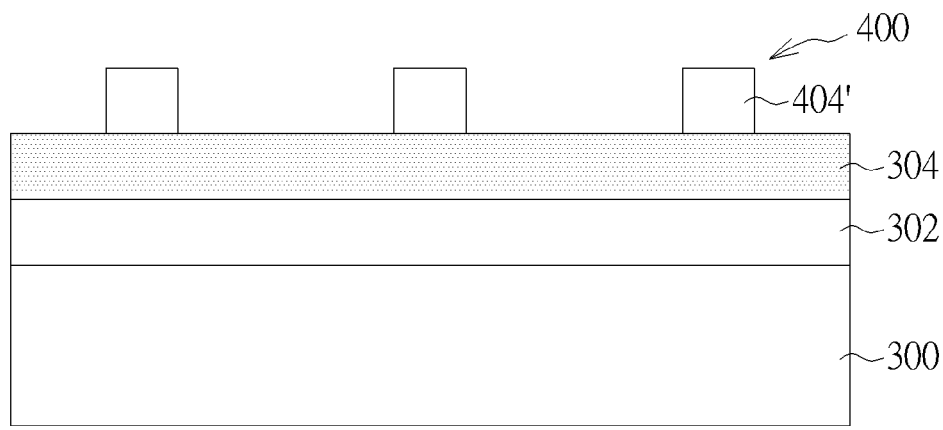

As shown in FIG. 4, a first lithography process 406 is performed, comprising using the first photo-mask 402 having the first revised pattern 400R during a first exposure process and a first development process, thus making the first photoresist layer 404 become a patterned first photoresist layer 404'. Since the first photo-mask 402 has the first revised pattern 400R compensated by the first OPC process, the formed patterned first photoresist layer 404' would have the first pattern 400. In this embodiment, the first photoresist layer 404 is a positive type photoresist material, but one having ordinary skills in the art shall also understand the first photoresist layer 404 may be a negative resist material. In one embodiment, after performing the first lithography process 406, the patterned first photoresist layer 404' can be subjected to an inspection process, for example, using a microscope or other instrument for observing the patterned first photoresist layer 404' to see if it contains the desired first pattern 400. If not, the parameters can be adjusted in real time, so correct patterns can be formed in the next batch of wafers.

Figure 5:
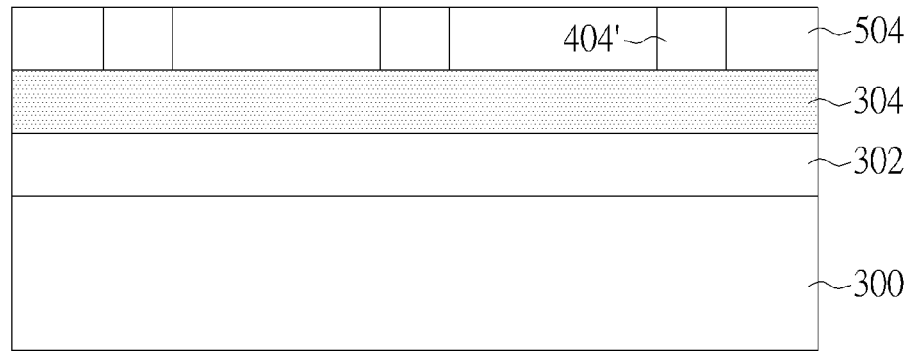

As shown in FIG. 5, a second photoresist layer 504 is formed, covering the hard mask 304. The thickness of the second photoresist layer 504 can be the same or different from that of the patterned first photoresist layer 404'. In the present embodiment, the second photoresist layer 504 has positive resist material, and it is not immiscible with the patterned first photoresist layer 404'.

Figure 6:
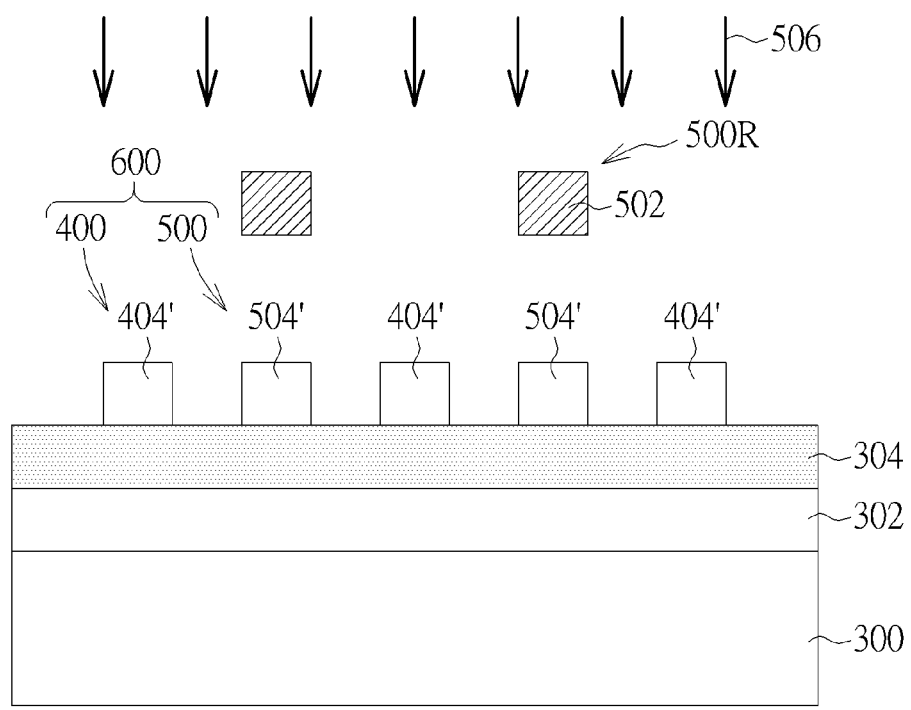

As shown in FIG. 6, a second lithography process 506 is performed, comprising using the second photo-mask 502 during a second exposure process and a second development process, thereby forming a patterned second photoresist layer 504'. Since the second photo-mask 502 has the second revised pattern 500R compensated by the second OPC process, the formed patterned second photoresist layer 504' would have the second pattern 500. In one embodiment, the second exposure process uses a light source only effects upon the second photoresist layer 504 and does not affect the patterned first photoresist layer 404'. Since the patterned first photoresist layer 404' has the first pattern 400, the patterned second photoresist layer 504' has the second pattern 500, they together form the target pattern 600. In one embodiment, after performing the second lithography process 506, the patterned second photoresist layer 504' and/or the patterned first photoresist layer 404' can be subjected to an inspection process, for example, using a microscope or other instrument for observing the patterned second photoresist layer 504' and/or the patterned first photoresist layer 404' to see if it contains the desired second pattern 500 and/or the desired first pattern 400. If not, the parameters can be adjusted in real time, so correct patterns can be formed in the next batch of wafers.

Figure 7:
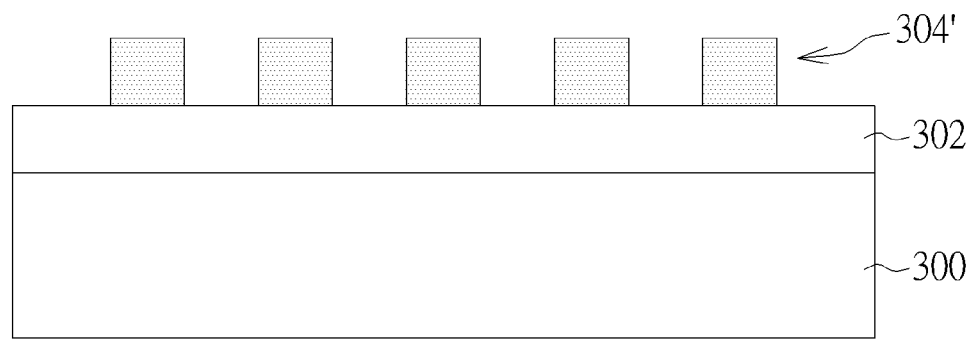

As shown in FIG. 7, a hard mask etching process 306 is performed by using the patterned first photoresist layer 404' and the patterned second photoresist layer 504' as a mask, thereby transferring the first pattern 400 of the patterned first photoresist layer 404' and the second pattern 500 of the second patterned photoresist layer 504' to the hard mask 304. A patterned hard mask 304' is therefore formed and thus comprises the target pattern 600. Thereafter, the patterned first photoresist layer 404' and the patterned second photoresist layer 504' are removed. In one embodiment, after the hard mask etching process 306, an inspection process can be performed to see if the patterned hard mask 304' has the desired target pattern 600.

Figure 8:
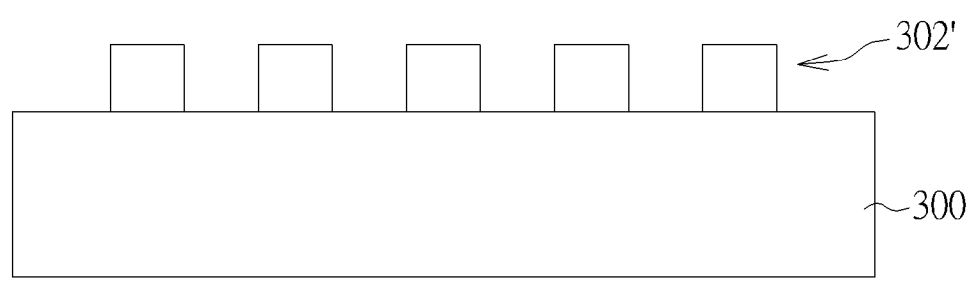

Finally, as shown in FIG. 8, a target layer etching process 308 is performed by using the patterned hard mask 304' as a mask, again transferring the target pattern 600 to the target layer 302, thereby forming a patterned target layer 302' having said target pattern 600. The patterned target layer 302' can therefore servers as a part of a semiconductor device, such as the fin structure of a non-planar transistor.

Above double patterning technique in FIG. 1 to FIG. 8 shows using the first photo-mask 402 and the second photo-mask 502 to form the target pattern 600. By OPC process, the formed patterned first photoresist layer 404' and the patterned second photoresist layer 504' can have desired first pattern 400 and correct second pattern 500, which together constitute the target pattern 600. However, due to the complexity of current semiconductor technology, the lithography and etching process requires more sophisticated control and verification. In the above embodiment shown in FIG. 1 to FIG. 8, although there are inspection processes after the first lithography process, the second lithography process, the hard mask etching process, the target layer etching process, but theses inspections only can adjust parameters of each step and cannot adjust the photo-mask, which directly relates to the formed patterns.

Figure 9:
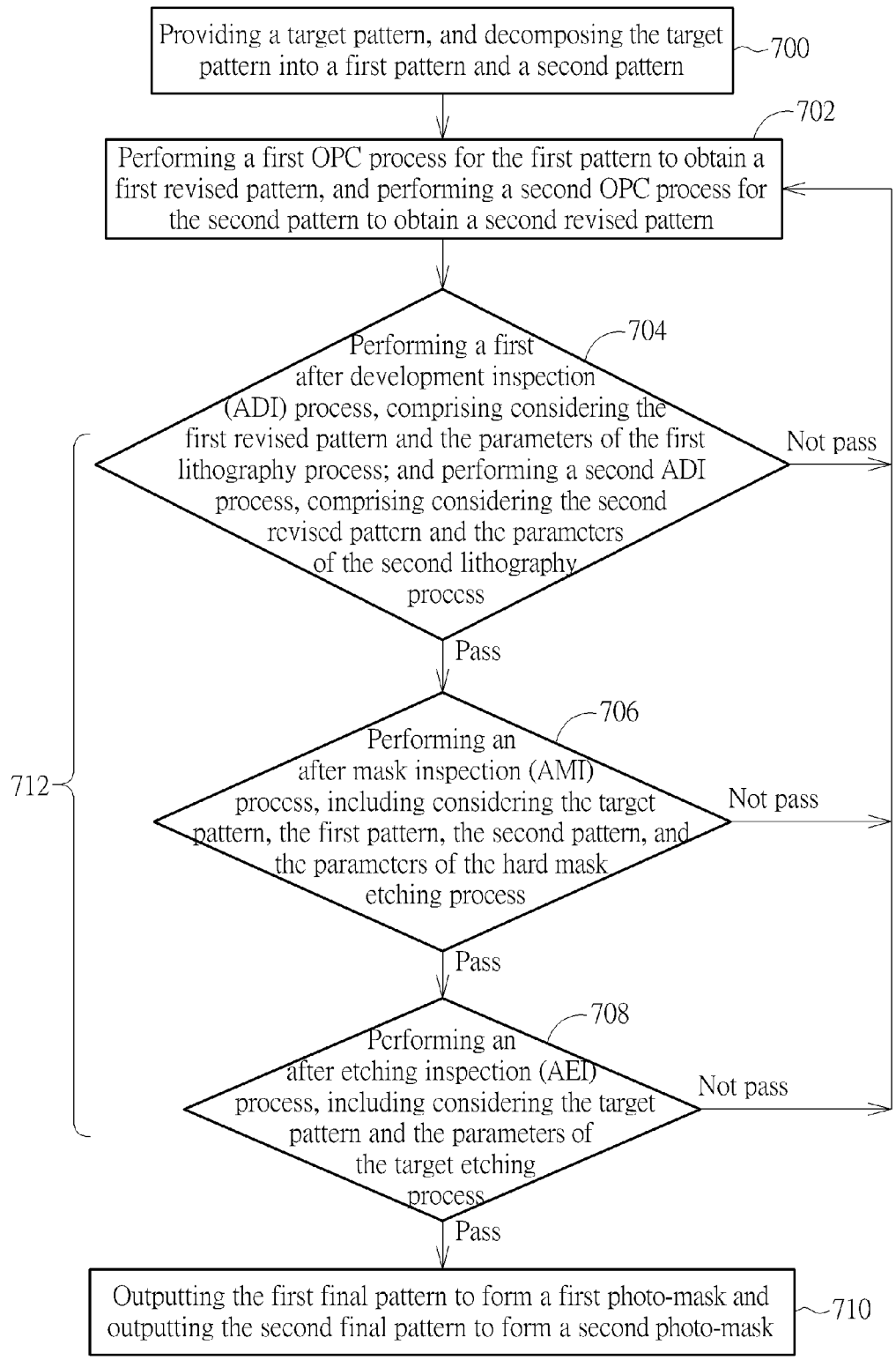
FIG. 9 shows a flowchart of a pattern verifying method according to one embodiment of the present invention.

Accordingly, a pattern verification method is proposed in another embodiment of the present invention. Please refer to FIG. 9, showing a flowchart of a pattern verifying method of the present invention. The preferred embodiment is applied in double patterning techniques, such as the steps shown in FIG. 1 to FIG. 8. Said double patterning technique comprises using the first photo-mask 402 and the second mask 502 to form the target pattern 600 in the hard mask 304 and the target layer 302. In order to ensure that the desired target pattern 600 can be formed, this method has novel inspection steps and processes, which will be explained as follows:

Step 700: providing a target pattern 600, and decomposing the target pattern 600 into a first pattern 400 and a second pattern 500 (also see to FIG. 1);

Step 702: performing a first OPC process for the first pattern 400 to obtain a first revised pattern 400R, and performing a second OPC process for the second pattern 500 to obtain a second revised pattern 500R (also see FIG. 2);

Step 704: performing a first after development inspection (ADI) process, comprising considering the first revised pattern 400R and the parameters of the first lithography process 406; and performing a second ADI process, comprising considering the second revised pattern 500R and the parameters of the second lithography process 506. For example, in a first correction process, a computer system is used and the parameters of the first revised pattern 400R and the first lithography process 406 (refer to FIG. 4) are considered and estimated, such as the light source, the lens, the development agent, the type of the first photo-mask 402, the material of the first photoresist layer 404, the thickness of the first photoresist layer 404, the baking process or other parameters that may affect the first lithography process 406, in order to ensure that the patterned first photoresist layer 404' can have the desired first pattern 400. Similarly, in a second correction process, a computer system is used and the parameters of the second revised pattern 500R and the second lithography process 506 (refer to FIG. 6) are considered and estimated, such as the light source, the lens, the development agent, the type of the second photo-mask 502, the material of the second photoresist layer 504, the thickness of the second photoresist layer 504, the baking process or other parameters that may affect the second lithography process 506. The second lithography process 506 preferably does not affect the patterned first photoresist layer 404'. In one embodiment, the first ADI process and/or the second ADI process further include checking if there is a weak pattern or not. The term "weak pattern" in the present invention means particular patterns that are prone to errors and easy to cause defects in the final product. For example, the weak pattern may include patterns easy to cause short, bridge or other bad patterns. If the desired pattern cannot be formed or there are weak patterns found in the first ADI process or the second ADI process, a repair process should be performed, and additional first OPC process and/or second OPC (i.e., step 702) should be carried out again. If passed, then proceed to the next step. In another embodiment, the first ADI process and/or the second ADI process may not be performed in the computer system, but can be performed in real time during manufacturing. For example, when performing the first lithography process 406, the formed patterned first photoresist layer 404' can be monitored at the same time, in order to check if the correct first pattern 400 formed in the patterned first photoresist layer 404'. Similarly, when performing the second lithography process 506, the formed patterned second photoresist layer 504' can be monitored at the same time, in order to check if the correct second pattern 500 formed in the patterned second photoresist layer 504'

Step 706: performing an after mask inspection (AMI) process, including considering the target pattern 600, the first pattern 400, the second pattern 500, and the parameters of the hard mask etching process 306. For example, in the hard mask etching process 306 shown in FIG. 7, the patterned first photoresist layer 404' having the first pattern 400 and the patterned second photoresist layer 504' having the second pattern 504 are used as a mask, to form the patterned hard mask 304' having the target pattern 600. In one embodiment of the invention, the first pattern 400, the second pattern 500, and the parameters of the hard mask etching process 306 are considered, such the type of etching (dry etching or wet etching), the etching bias power, the etching temperature, the etching gas, the etchant, the thickness or material of the patterned first photoresist layer 404', the thickness or material of the patterned second photoresist layer 504', or the thickness or material of the hard mask 304, or other parameters that may affect the etching process. In one embodiment, the AMI process includes checking if there are weak patterns formed in the patterned hard mask 304'. If the desired pattern cannot be formed or there are weak patterns found in the AMI process, a repair process should be performed, and process will be back to step 702. If passed, it proceeds to the next step. In another embodiment, the AMI process may be performed in real time during manufacturing. For example, when performing the hard mask etching process 306, the formed patterned hard mask 304' can be monitored at the same time.

Step 708: performing an after etching inspection (AEI) process, including considering the target pattern 600 and the parameters of the target etching process 308. For example, in the target layer etching process 308 shown in FIG. 8, the patterned hard mask 304' having the target pattern 600 is used as a mask, to form the patterned target layer 302' having the target pattern 600. In one embodiment of the invention, the target pattern 600 and the parameters of the target layer etching process 308 are considered, such the type of etching (dry etching or wet etching), the etching bias power, the etching temperature, the etching gas, the etchant, the thickness or material of the patterned hard mask 304', or the thickness or material of the target layer 302, or other parameters that may affect the etching process. In one embodiment, the AEI process includes checking if there are weak patterns formed in the patterned target layer 302'. If the desired pattern cannot be formed or there are weak patterns found in the AEI process, a repair process should be performed, and process is back to step 702. If passed, it proceeds to the next step. In another embodiment, the AEI process may be performed in real time during manufacturing. For example, when performing the target layer etching process 308, the formed patterned target layer 302' can be monitored at the same time.

Step 710: outputting the first final pattern to form a first photo-mask 402 and outputting the second final pattern to form a second photo-mask 502. The term "first final pattern" refers to the pattern corresponding to the first pattern 400 and passes the inspection process in steps 704, 706 and 708. If the original first revised pattern does not pass the inspection processes, a repair process should be performed and additional first OPC process is carried out to form more correct pattern, which is then subjected to these inspection processes. Once the first revised pattern passes inspection processes, it becomes the first final pattern. For the second final pattern, it is similar.

The present invention is characterized in that, for the double patterning technology, at least one post hard mask inspection process is performed to obtain a precise pattern. In one embodiment, step 704 (i.e., the first ADI process, the second ADI process), step 706 (i.e. the AMI process) and step 708 (i.e., the AEI process) may be together called an inspection step 712. While in another embodiment, step 708 may be omitted. Furthermore, the foregoing embodiment shows double lithography/single etching process (2P1E), but one skilled in the art may understand the present invention can also be used in other types of double patterning techniques, such as double lithography/double etching process (2P2E) technology. The 2P2E process, is to decompose the etching process into a first etching process and a second etching process. Specifically, after the first lithography process, a first etching process is performed immediately, and the first pattern is transferred to the hard mask to form a first patterned hard mask. Subsequently, the second lithography process and a second etching process are performed, and the second pattern is transferred to the first patterned hard mask, to form a final patterned hard mask having the target pattern. In this embodiment, the inspection process sequentially comprises: a first ADI process (for inspecting the first lithography process), a first AEI process (for inspecting the first etching process), a second ADI process (for inspecting the second lithography process), a second AEI process (for inspecting the second etching process), and an AMI process (for inspecting the target layer etching process). In this embodiment, the foregoing step 708 that consider the parameters of the hard mask etching process would further comprises considering the parameters of the first etching process and/or the parameters of the second etching process. Parameters of the first etching process comprises: the type of etching, the etching bias power, the etching temperature, the etching gas, the etchant, the material or the thickness or material of the patterned first photoresist layer, the material or the thickness of the hard mask, but not limited thereto. Parameters of the second etching process comprises: the type of etching, the etching bias power, the etching temperature, the etching gas, the etchant, the material or the thickness of the patterned second photoresist layer, the material or the thickness of the hard mask, but not limited thereto.

In summary, the pattern verification method provided by the present invention is mainly used in DPT and is featured by considering every step in DPT. Accordingly, the formed patterned hard mask can have target pattern precisely.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pattern verifying method related to a double patterning technology (DPT) process, comprising:
    decomposing a target pattern into a first pattern and a second pattern by using a computer system;
    performing a first optical proximity correction (OPC) process for the first pattern to obtain a first revised pattern, and performing a second OPC process for the second pattern to obtain a second revised pattern; and
    performing an inspection process, wherein the inspection process comprises an after mask inspection (AMI) process, which comprises considering the target pattern, the first pattern and the second pattern, wherein the DPT process comprises using a hard mask etching process to form a patterned hard mask with the target pattern, and the DPT process comprises using a first photo-mask and a second photo-mask, and wherein the AMI process comprises checking if the patterned hard mask comprises a weak pattern, and wherein the DPT process further comprises performing a target layer etching process by using the patterned hard mask as a mask to form a patterned target layer, and the inspection process comprises an after etching inspection (AEI) process, wherein the AEI process comprises checking if the patterned target layer comprises a weak pattern.

2. The pattern verifying method according to claim 1, if the inspection process is passed, outputting the first revised pattern to form the first photo-mask, and outputting the second revised pattern to form the second photo-mask.

3. The pattern verifying method according to claim 1, if the inspection process is not passed, a repair process is performed for the first revised pattern and/or the second revised pattern.

4. The pattern verifying method according to claim 3, wherein the repair process comprises performing a third OPC process for the first revised pattern and a fourth OPC process for the second revised pattern.

5. The pattern verifying method according to claim 1, wherein the DPT process comprises:
    performing a first lithography process for a first photoresist layer by using the first photo-mask;
    performing a second lithography process for a second photoresist layer by using the second photo-mask; and
    performing the hard mask etching process to etch a hard mask thereby forming the patterned hard mask.

6. The pattern verifying method according to claim 5, wherein the inspection process further comprises a first ADI (after development inspection) process, which comprises considering the first revised pattern and parameters of the first lithography process.

7. The pattern verifying method according to claim 6, wherein the parameters of the first lithography process comprise: light source, lens, development agent, type of the first photo-mask, and a material or thickness of the first photoresist layer.

8. The pattern verifying method according to claim 6, wherein the inspection process further comprises a second ADI process, which comprises consider the second revised pattern and parameters of the second lithography process.

9. The pattern verifying method according to claim 8, wherein the parameters of the second lithography process comprises: light source, lens, development agent, type of the second photo-mask, and a material or thickness of the second photoresist layer.

10. The pattern verifying method according to claim 1, wherein the DPT process comprises:
    performing a first lithography process for a first photoresist layer by using the first photo-mask;
    performing a first etching process for etching a hard mask;
    performing a second lithography process for a second photoresist layer by using the second photo-mask; and
    performing a second etching process for etching the hard mask, thereby forming the patterned hard mask.

11. A pattern verifying method related to a double patterning technology (DPT) process, comprising:
    decomposing a target pattern into a first pattern and a second pattern by using a computer system;
    performing a first optical proximity correction (OPC) process for the first pattern to obtain a first revised pattern, and performing a second OPC process for the second pattern to obtain a second revised pattern;
    performing an inspection process, wherein the inspection process comprises an after mask inspection (AMI) process, which comprises considering the target pattern, the first pattern and the second pattern, wherein the DPT process comprises:
        performing a first lithography process for a first photoresist layer by using a photo-mask;
        performing a second lithography process for a second photoresist layer by using a second photo-mask; and
        performing a hard mask etching process to etch a hard mask thereby forming a patterned hard mask, and the inspection process further comprises a first ADI (after development inspection) process, which comprises considering the first revised pattern and parameters of the first lithography process, and a second ADI process, which comprises considering the second revised pattern and parameters of the second lithography process; and
    after the inspection process, if the inspection process is not passed, a repair process is performed for the first revised pattern and/or the second revised pattern.

* * * * *